(12) United States Patent
Zhu et al.

(10) Patent No.: US 12,029,047 B2
(45) Date of Patent: Jul. 2, 2024

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Yiming Zhu, Hefei (CN); Xiaoguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 396 days.

(21) Appl. No.: 17/647,658

(22) Filed: Jan. 11, 2022

(65) Prior Publication Data

US 2022/0208855 A1    Jun. 30, 2022

Related U.S. Application Data

(63) Continuation of application No. PCT/CN2021/095837, filed on May 25, 2021.

(30) Foreign Application Priority Data

Dec. 29, 2020   (CN) .......................... 202011596138.4

(51) Int. Cl.
  *H10B 61/00*   (2023.01)
  *H10B 12/00*   (2023.01)
  (Continued)

(52) U.S. Cl.
  CPC ............. *H10B 61/22* (2023.02); *H10B 12/05* (2023.02); *H10B 12/30* (2023.02); *H10B 63/00* (2023.02);
  (Continued)

(58) Field of Classification Search
  CPC ........ H10B 61/22; H10B 12/05; H10B 12/30; H10B 63/00; H10B 12/00; H10B 51/30;
  (Continued)

(56) References Cited

U.S. PATENT DOCUMENTS

| 6,121,080 A | 9/2000 | Wu |
| 6,396,096 B1 | 5/2002 | Park |

(Continued)

FOREIGN PATENT DOCUMENTS

| CN | 1495906 A | 5/2004 |
| CN | 1702869 A | 11/2005 |

(Continued)

OTHER PUBLICATIONS

T. Schloesser et al., "A 6F2 Buried Wordline DRAM Cell for 40nm and Beyond", Published in: 2008 IEEE International Electron Devices Meeting, Date of Conference: Dec. 15-17, 2008, Date Added to IEEE Xplore: Feb. 27, 2009, DOI: 10.1109/IEDM.2008.4796820, Publisher: IEEE, 4 pages.

(Continued)

*Primary Examiner* — Yasser A Abdelaziz
(74) *Attorney, Agent, or Firm* — Kilpatrick Townsend & Stockton LLP (57) ABSTRACT

The present application relates to a semiconductor structure and its forming method. The semiconductor structure comprises a substrate; a first transistor, including a first channel region disposed within the substrate, and a first end disposed at surface of the substrate, the first end being adapted to connect with a first-type storage cell; and a second transistor, including a second channel region disposed within the substrate, and a second end disposed at surface of the substrate, the second end being adapted to connect with a second-type storage cell, the first channel region and the second channel region having different areas.

20 Claims, 3 Drawing Sheets

(51) Int. Cl.
*H10B 63/00* (2023.01)
*H10N 50/01* (2023.01)
*H10N 50/80* (2023.01)
*H10N 70/20* (2023.01)

(52) U.S. Cl.
CPC ............ *H10N 50/01* (2023.02); *H10N 50/80* (2023.02); *H10N 70/231* (2023.02)

(58) Field of Classification Search
CPC ........ H10B 12/03; H10B 12/31; H10B 53/30; H10B 63/30; H10B 12/053; H10N 50/01; H10N 50/80; H10N 70/231; H01L 27/105
See application file for complete search history.

(56) References Cited

U.S. PATENT DOCUMENTS

| | | | |
|---|---|---|---|
| 10,468,103 | B2 | 11/2019 | Kim et al. |
| 2003/0067819 | A1 | 4/2003 | Satomi |
| 2006/0237726 | A1 | 10/2006 | Iwamatsu et al. |
| 2008/0073709 | A1 | 3/2008 | Fujimoto et al. |
| 2011/0215382 | A1 | 9/2011 | Asao et al. |
| 2014/0077303 | A1 | 3/2014 | Baek |
| 2017/0033279 | A1* | 2/2017 | Lee .................. H10N 50/01 |
| 2019/0221669 | A1* | 7/2019 | Lee .................. H10B 12/30 |
| 2022/0115381 | A1* | 4/2022 | Cheng ................ H10B 12/053 |

FOREIGN PATENT DOCUMENTS

| | | |
|---|---|---|
| CN | 102214578 A | 10/2011 |
| CN | 103904082 A | 7/2014 |
| CN | 106158751 A | 11/2016 |
| CN | 106935508 A | 7/2017 |
| CN | 107731907 A | 2/2018 |
| CN | 108133936 A | 6/2018 |
| CN | 109524399 A | 3/2019 |
| CN | 110111822 A | 8/2019 |
| CN | 209641689 U | 11/2019 |
| CN | 110943102 A | 3/2020 |
| CN | 111223862 A | 6/2020 |
| CN | 111755386 A | 10/2020 |
| CN | 111799260 A | 10/2020 |
| JP | 08316427 A | 11/1996 |
| JP | 2014049725 A | 3/2014 |

OTHER PUBLICATIONS

An Chen, "A review of emerging non-volatile memory (NVM) technologies and applications", (Solid-State Electronics vol. 125, Nov. 2016, pp. 25-38), https://www.sciencedirect.com/science/article/abs/pii/S0038110116300867.

P. M. Kibuule et al., "CMOS Effective Channel Size Measurements", Superconducting Super Collider Laboratory, Jan. 1994, https://lss.fnal.gov/archive/other/ssc/ssc-n-845.pdf, 8 pages.

Ravi Patel et al., "Field Driven STT-MRAM Cell for Reduced Switching Latency and Energy", Published in: 2014 IEEE International Symposium on Circuits and Systems (ISCAS), Date of Conference: Jun. 1-5, 2014, Date Added to IEEE Xplore: Jul. 26, 2014, DOI: 10.1109/ISCAS.2014.6865599, Publisher: IEEE, pp. 2173-2176.

International Search Report as cited in PCT Application No. PCT/CN2021/095837 mailed Sep. 9, 2021, 9 pages.
International Search Report as cited in PCT Application No. PCT/CN2021/095828 mailed Sep. 15, 2021, 8 pages.
International Search Report as cited in PCT Application No. PCT/CN2021/095830 mailed Sep. 13, 2021, 8 pages.
International Search Report as cited in PCT Application No. PCT/CN2021/102238 mailed Sep. 28, 2021, 8 pages.

* cited by examiner

SEMICONDUCTOR STRUCTURE AND FORMING METHOD THEREOF

CROSS-REFERENCE TO RELATED APPLICATIONS

The present application is a continuation of International Patent Application No. PCT/CN2021/095837, filed on May 25, 2021, which claims the right of priority of Chinese Patent Application No. 202011596138.4, filed on Dec. 29, 2020, and entitled "Semiconductor Structure and its Forming Method thereof". International Patent Application No. PCT/CN2021/095837 and Chinese Patent Application No. 202011596138.4 are hereby incorporated by reference in their entireties.

TECHNICAL FIELD

The present application relates to the technical field of semiconductor fabrication, and more particularly to a semiconductor structure and its forming method.

BACKGROUND

The dynamic random access memory (DRAM) is a semiconductor device frequently used in such electronic equipments as computers, it consists of plural storage cells, each of which usually includes a transistor and a capacitor. The gate electrode of the transistor is electrically connected to the wordline, the source electrode is electrically connected to the bitline, the drain electrode is electrically connected to the capacitor, and wordline voltage on the wordline can control the On & Off of the transistor, so that data information stored in the capacitor can be read via the bitline, or data information can be written into the capacitor.

The magnetic random access memory (MRAM) is an integration based on silicon-based complementary oxide semiconductor (CMOS) and magnetic tuning junction (MTJ) technologies, being a nonvolatile memory, it possesses both the high-speed writing and reading capabilities of a static random access memory and the high integration of a dynamic random access memory. The magnetic tuning junction usually consists of a fixed layer, a tunneling layer and a free layer. When the magnetic random access memory normally operates, magnetization direction of the free layer may change, while magnetization direction of the fixed layer remains unchanged. Resistance of the magnetic random access memory is relevant to the relative magnetization directions of the free layer and the fixed layer. When the magnetization direction of the free layer changes relative to the magnetization direction of the fixed layer, resistance value of the magnetic random access memory correspondingly changes to correspond to different storage information.

In order to enhance storage density of the memory, and to reduce size of the storage cell, buried wordline (BWL) has been widely used in DRAM. However, in order to avoid the occurrence of leakage current, it required for DRAMs with buried wordline structure to employ relatively small drive current to drive the transistor. But as for MRAMs, since it is needed to ensure start of the MTJ switch, relatively large drive current is required to be used to drive the transistor. Since the drive current of DRAMs and the drive current of MRAMs are different in magnitude, it is currently impossible to implement the buried wordline structure in MRAM, and this restricts enlargement of storage density and reduction in size of storage cell of MRAMs.

It is therefore a technical problem to be urgently dealt with as how to enhance the performance of the memory, so as to enlarge the fields of application of the memory.

SUMMARY

According to some embodiments, this disclosure provides a method for manufacturing a semiconductor structure, which includes:
a substrate;
a first transistor, including a first channel region disposed within the substrate, and a first end disposed at surface of the substrate, the first end being adapted to connect with a first-type storage cell; and
a second transistor, including a second channel region disposed within the substrate, and a second end disposed at surface of the substrate, the second end being adapted to connect with a second-type storage cell, the first channel region and the second channel region having different areas.

According to some embodiments of the present application, a method of forming a semiconductor structure is provided, which method comprises the following steps:
providing a substrate; and
forming a first transistor and a second transistor, the first transistor including a first channel region disposed within the substrate, and a first end disposed at surface of the substrate, the first end being adapted to connect with a first-type storage cell, the second transistor including a second channel region disposed within the substrate, and a second end disposed at surface of the substrate, the second end being adapted to connect with a second-type storage cell, the first channel region and the second channel region having different areas.

The descriptions only summarize the technical solutions of this disclosure. To know the technical means of this disclosure more clearly, and implement according to the contents of the description, the following will describe by combining preferred embodiments of this disclosure and the brief description of the drawings.

BRIEF DESCRIPTION OF DRAWINGS

To describe the technical solutions in embodiments of this disclosure more clearly, the accompanying drawings required for describing the embodiments are briefly introduced below. It is apparent that the accompanying drawings in the following description show merely some embodiments of this disclosure, and a person of ordinary skill in the art can still derive other accompanying drawings in embodiments from these accompanying drawings without an inventive effort.

DESCRIPTION OF EMBODIMENTS

Detailed description is made below to the specific embodiments of the semiconductor structure and its forming method proposed by the present application in conjunction with the accompanying drawings.

Figure 1:
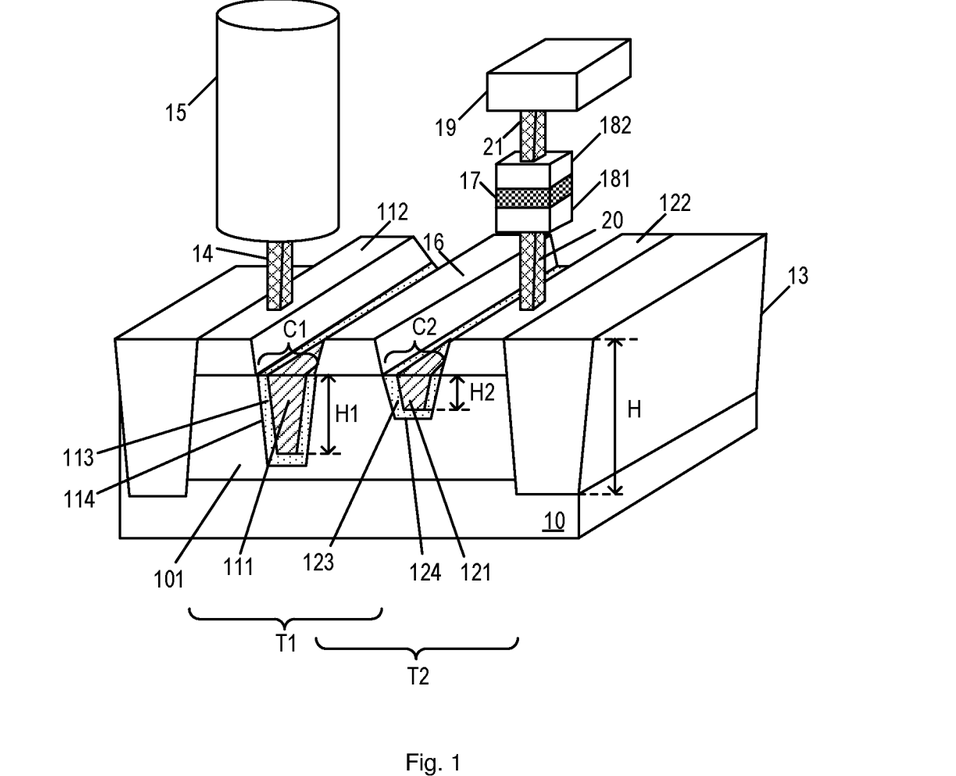
FIG. 1 is a diagram schematically illustrating the semiconductor structure in the specific embodiments of the present application.

This specific embodiment proposes a semiconductor structure, and FIG. 1 is a diagram schematically illustrating the semiconductor structure in the specific embodiment of the present application. As shown in FIG. 1, the semiconductor structure provided by this specific embodiment of the present application comprises:

a substrate 10;

a first transistor T1, including a first channel region C1 disposed within the substrate 10, and a first end 112 disposed at surface of the substrate 10, the first end 112 being adapted to connect with a first-type storage cell 15; and a second transistor T2, including a second channel region C2 disposed within the substrate 10, and a second end 122 disposed at surface of the substrate 10, the second end 122 being adapted to connect with a second-type storage cell 17, the first channel region C1 and the second channel region C2 having different areas.

Specifically speaking, as shown in FIG. 1, the substrate 10 can be, but is not restricted to be, a silicon substrate. This specific embodiment takes a silicon substrate as an example to describe the substrate 10. In other examples, the substrate 10 may be such a semiconductor substrate as of gallium nitride, gallium arsenide, gallium carbide, silicon carbide or SOI. In the substrate 10 are arranged a plurality of active areas in an array, and adjacent active areas are separated from each other via a shallow groove separation structure 13. The first transistor T1 and the second transistor T2 can be located either in the same and single active area, or in different active areas, as this is adjustable by persons skilled in the art according to actual requirement.

The first channel region C1 of the first transistor T1 and the second channel region C2 of the second transistor T2 can be both located inside the substrate 10, accordingly, during the process of forming the first transistor T1 and the second transistor T2, it is possible to simultaneously form the first channel region C1 and the second channel region C2 by etching the substrate 10, thereby realizing fabrication techniques of the first transistor T1 and the second transistor T2 compatible, and helping to enhance integration density of the storage cells of the first transistor T1 and/or the second transistor T2 in the memory, and to reduce the size of the storage cells. At the same time, by integrating the first transistor T1 and the second transistor T2 in a single semiconductor structure (such as a memory), and by defining that the first channel region C1 of the first transistor T1 and the second channel region C2 of the second transistor T2 have different areas, the effect is achieved that drive current of the first transistor T1 is different from drive current of the second transistor T2, to thereby realize complementation of the performances of the first transistor T1 and the second transistor T2, enhance the performance of the memory, and lay foundation for enlarging the fields of application of the memory.

The substrate 10 can have therein a P-type well region 101 formed by p-type ion doping; the first end 112 of the first transistor and the second end 122 of the second transistor can be correspondingly both source electrodes or drain electrodes formed by n-type ion doping. If the first end 112 of the first transistor T1 is a drain electrode, another end of the first transistor T1 will be a source electrode, and the region between the source electrode and the drain electrode of the first transistor T1 is the first channel region C1 of the first transistor T1. If the second end 122 of the second transistor T2 is a drain electrode, another end of the second transistor T2 will be a source electrode, and the region between the source electrode and the drain electrode of the second transistor T2 is the second channel region C2 of the second transistor T2. Specifically, as shown in FIG. 1, the first transistor T1 and the second transistor T2 have a common end 16. The common end 16 can be a source electrode shared by the first transistor T1 and the second transistor T2, the region between the common end 16 and the first end 112 is the first channel region C1 of the first transistor T1, and the region between the common end 16 and the second end 122 is the second channel region C2 of the second transistor T2. The area of the first channel region C1 can be the surface area on the substrate 10 on which the first channel region C1 occupies, and the area of the second channel region C2 can be the surface area on the substrate 10 on which the second channel region C2 occupies; as shown in FIG. 1, the first channel region C1 is a U-shaped in the substrate 10, and the area of the first channel region C1 can be a summation of the bottom area of the U shape and the sidewall area of the U shape. By the same token, the second channel region C2 is a U-shaped in the substrate 10, and the area of the second channel region C2 can be a summation of the bottom area of the U shape and the sidewall area of the U shape.

In some embodiments, the substrate 10 can have therein an N-type well region 101 formed by N-type ion doping. The first end 112 of the first transistor T1 and the second end 122 of the second transistor T2 can be correspondingly both source electrodes or drain electrodes formed by p-type ion doping.

In some embodiments, the semiconductor structure further comprises a first gate electrode 111 that is disposed in a first gate slot 114 enclosed by the first channel region C1, and a second gate electrode 121 that is disposed in a second gate slot 124 enclosed by the second channel region C2.

Specifically speaking, as shown in FIG. 1, the first channel region C1 encloses the first gate slot 114, the sidewall surface of the first gate slot 114 covers a first gate insulation layer 113, and the first gate electrode 111 is filled inside the first gate slot 114 and covers the surface of the first gate insulation layer 113. The second channel region C2 encloses the second gate slot 124, the sidewall surface of the second gate slot 124 covers a second gate insulation layer 123, and the second gate electrode 121 is filled inside the second gate slot 124 and covers the surface of the second gate insulation layer 123. The first gate slot 114, the first gate insulation layer 113 and the first gate electrode 111 can be respectively simultaneously formed with the second gate slot 124, the second gate insulation layer 123 and the second gate electrode 121, so as to simplify fabrication technique of the semiconductor structure.

In some embodiments, the first gate electrode 111 has a depth H1 extending inside the substrate 10 greater than a depth H2 of the second gate electrode 121 extending inside the substrate 10.

Figure 4:
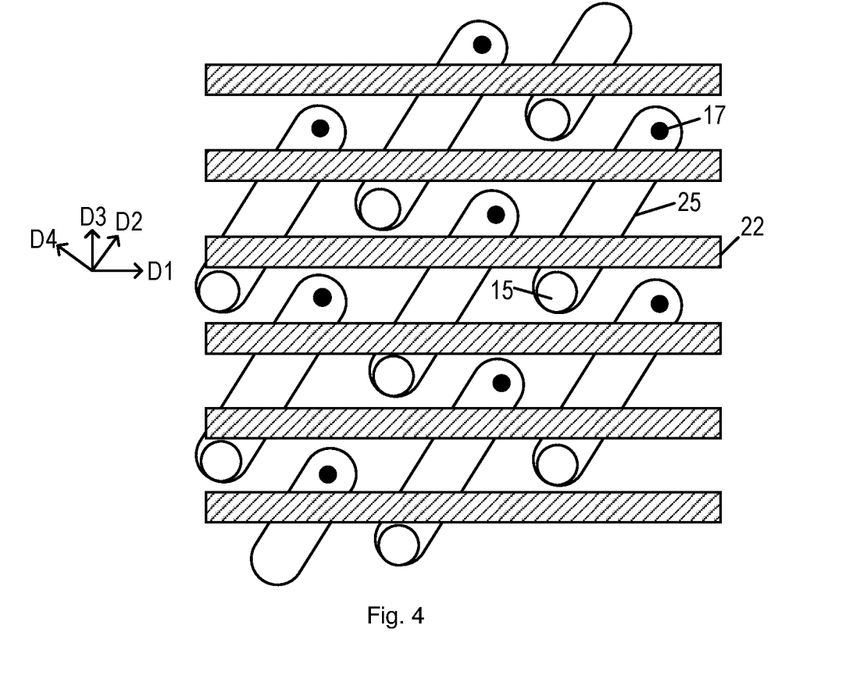
FIG. 4 is a diagram schematically illustrating a mode of arranging a plurality of third active areas in the specific embodiments of the present application.
Figure 5:
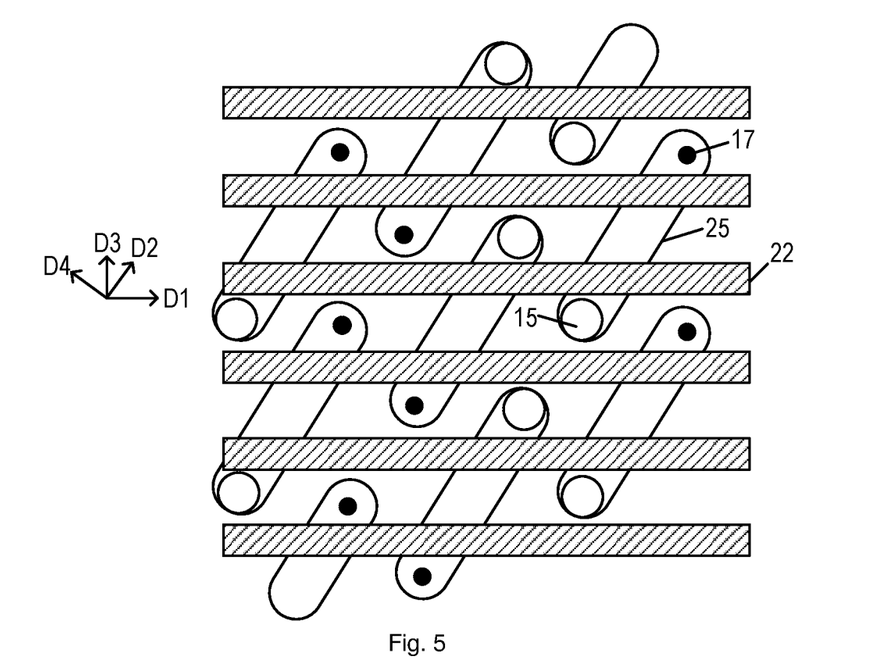
FIG. 5 is a diagram schematically illustrating another mode of arranging a plurality of third active areas in the specific embodiments of the present application.

Specifically speaking, the effect that the area of the first channel region C1 is greater than the area of the second channel region C2 can be achieved by setting the depth H1 of the first gate electrode 111 extending inside the substrate 10 greater than the depth H2 of the second gate electrode 121 extending inside the substrate 10. It is also possible for persons skilled in the art to base on actual requirement to adjust the relative widths of the first gate electrode 111 and the second gate electrode 121, so as to achieve the effect that the area of the first channel region C1 is greater than the area of the second channel region C2. Alternatively, the relative widths of the first gate electrode 111 and the second gate electrode 121 as well as the relative depths of the first gate electrode 111 and the second gate electrode 121 inside the substrate 10 can be simultaneously adjusted, so as to achieve the effect that the area of the first channel region C1 is greater than the area of the second channel region C2. The width of the first gate electrode 111 can be the length of the first gate electrode 111 perpendicular to its extension direction and parallel to the surface direction of the substrate 10, and the width of the second gate electrode 121 can be the length of the second gate electrode 121 perpendicular to its extension direction and parallel to the surface direction of the substrate 10. As can be understood, the first gate electrode 111 can be the part of the wordline 22 located on the first transistor T1 of the active area, and the second gate electrode 121 can be the part of the wordline 22 located on the second transistor T2 of the active area; specifically, as shown in FIGS. 4 and 5, the substrate 10 includes a plurality of third active areas 25 and shallow groove separation structures between the third active areas 25, wordlines 22 pass through the plurality of third active areas 25 and shallow groove separation structures between the third active areas 25, and the part overlapped by wordlines 22 and third active areas 25 can be the first gate electrode 111 or the second gate electrode 121. Specifically, the part overlapped by a wordline 22 and the first transistor T1 of the third active area 25 is the first gate electrode 111, and the part overlapped by a wordline 22 and the second transistor T2 of the third active area 25 is the second gate electrode 121.

In some embodiments, the semiconductor structure further comprises a plurality of active areas arranged within the substrate 10 in an array, and a shallow groove separation structure 13 that is disposed between adjacent active areas; the shallow groove separation structure 13 has a height H, the depth H1 of the first gate electrode 111 extending inside the substrate 10 is greater than or equal to 0.5H, and the depth H2 of the second gate electrode 121 extending inside the substrate 10 is less than 0.5H.

In some embodiments, the depth H2 of the second gate electrode 121 extending inside the substrate 10 is less than 0.5H and greater than or equal to 0.1H.

Specifically speaking, the shallow groove separation structure 13 extends from the interior of the substrate 10 to the exterior of the substrate 10, that is to say, the bottom surface of the shallow groove separation structure 13 is located at the surface inside, on top of, flush with, or protruding from or lower than the substrate 10. With the height H (the height perpendicular to the surface direction of the substrate 10) of the shallow groove separation structure 13 as a standard of reference, the depth H1 of the first gate electrode 111 extending inside the substrate 10 is set to be greater than or equal to 0.5H, and the depth H2 of the second gate electrode 121 extending inside the substrate 10 is set to be less than 0.5H and greater than or equal to 0.1H, at the same time, the width of the first gate electrode 111 is equalized with the width of the second gate electrode 121, whereby drive current of the second transistor T2 can be more apparently increased. For instance, when the depth of the second gate electrode 121 extending inside the substrate 10 is 0.1H, drive current of the second transistor will be increased by 20% (relative to the drive current of the second transistor T2 when the extending depth is 0.5H). When the depth of the second gate electrode 121 extending inside the substrate 10 is less than 0.1H, severe short-channel effect would be caused thereby, and the performance of the second transistor T2 would be lowered.

Figure 2:
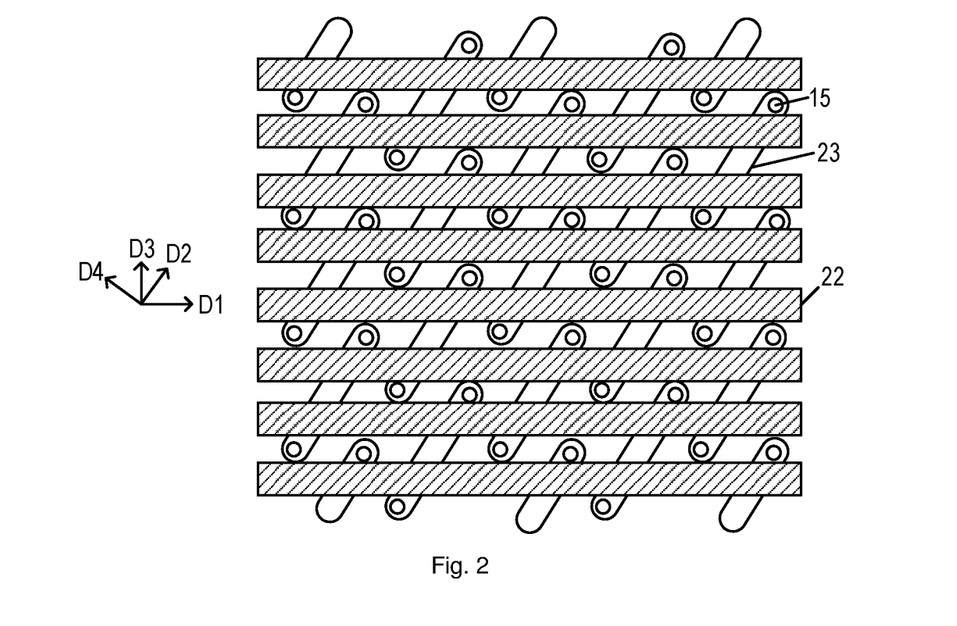
FIG. 2 is a diagram schematically illustrating the mode of arranging a plurality of first active areas in the specific embodiments of the present application.

In some embodiments, the plurality of active areas have therein at least one first active area 23, and the first active area 23 has two first transistors T1; the two first transistors T1 are distributed at opposite sides of extension direction of the first active area 23, and the two first transistors T1 in the first active area 23 share a first common end.

FIG. 2 is a diagram schematically illustrating the mode of arranging a plurality of first active areas in the specific embodiments of the present application. By way of example, as shown in FIG. 2, the substrate 10 has therein a plurality of wordlines 22 extending along a first direction D1, and the wordlines 22 are arranged in parallel along a third direction D3 that is perpendicular to the first direction D1. A plurality of first active areas 23 are arranged within the substrate 10 in an array, and each first active area 23 extends along a second direction D2. The second direction D2 is inclined relative to the first direction D1 for a predetermined angle. The specific numerical value of the predetermined angle can be set by persons skilled in the art according to actual requirement, for instance, the predetermined angle can be greater than or equal to 15o and less than 30o. Two wordlines 22 pass through one first active area 23 and respectively control two first transistors T1 on the first active area 23, and two first channel regions C1 of the two first transistors T1 are both located within the substrate 10 and have identical area. The two first transistors T1 are distributed at opposite sides of the first active area 23 along the second direction D2. First ends 112 of the two first transistors T1 are both located at opposite ends of the first active area 23, and the two first transistors T1 share the first common end. For instance, the first end 112 of the first transistor T1 is a drain end, the first common end is a first common source end, and the two first transistors T1 in the same and single first active area 23 share the first common source end. The first common end can be disposed at the middle portion of the first active area 23, namely the part between two wordlines 22 on the first active area 23. The two first transistors T1 in the same first active area 23 are respectively electrically connected with two first-type storage cells 15.

Figure 3:
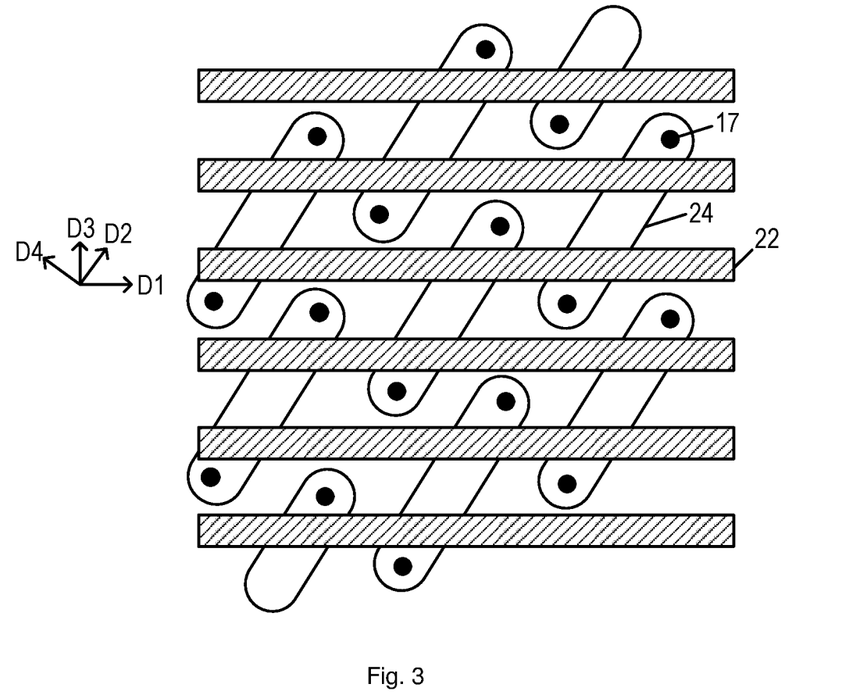
FIG. 3 is a diagram schematically illustrating the mode of arranging a plurality of second active areas in the specific embodiments of the present application.

In some embodiments, the plurality of active areas have therein at least one second active area 24, and the second active area 24 has two second transistors T2; the two second transistors T2 are distributed at opposite sides of extension direction of the second active area 24, and the two second transistors T2 in the second active area 24 share a second common end.

FIG. 3 is a diagram schematically illustrating the mode of arranging a plurality of second active areas in the specific embodiments of the present application. By way of example, as shown in FIG. 3, the substrate 10 has therein a plurality of wordlines 22 extending along a first direction D1, and the wordlines 22 are arranged in parallel along a third direction D3 that is perpendicular to the first direction D1. A plurality of second active areas 24 are arranged within the substrate 10 in an array, and each second active area 24 extends along a second direction D2. The second direction D2 is inclined relative to the first direction D1 for a predetermined angle. The specific numerical value of the predetermined angle can be set by persons skilled in the art according to actual requirement, for instance, the predetermined angle can be greater than or equal to 15o and less than 30o. Two wordlines 22 pass through one second active area 24 and respectively control two second transistors T2 on the second active area 24, and two second channel regions C2 of the two second transistors T2 are both located within the substrate 10 and have identical area. The two second transistors T2 are distributed at opposite sides of the second active area 24 along the second direction D2. Second ends 122 of the two second transistors T2 are both located at opposite ends of the second active area 24, and the two second transistors T2 share the second common end. For instance, the second end 122 of the second transistor is a drain end, the second common end is a second common source end, and the two second transistors T2 in the same and single second active area 24 share the second common source end. The second common end can be disposed at the middle portion of the second active area 24, namely the part between two wordlines 22 on the second active area 24. The two second transistors T2 in the same second active area 24 are respectively electrically connected with two second-type storage cells 17.

In some embodiments, the plurality of active areas have therein at least one third active area 25, and the third active area 25 has one first transistor T1 and one second transistor T2; the first transistor T1 and the second transistor T2 are distributed at opposite sides of extension direction of the third active area 25, and the first transistor T1 and the second transistor T2 in the third active area 25 share a third common end.

In some embodiments, the semiconductor structure further includes a plurality of wordlines 22 extending along a first direction; a plurality of the third active areas 25 are arranged within the substrate 10 in an array, the third active areas 25 extend along a second direction D2, and the second direction D2 is inclined relative to the first direction for a predetermined angle.

FIG. 4 is a diagram schematically illustrating the mode of arranging a plurality of third active areas in the specific embodiments of the present application, and FIG. 1 is a diagram schematically illustrating one third active area 25 in FIG. 4. By way of example, as shown in FIGS. 1 and 4, the substrate 10 has therein a plurality of wordlines 22 extending along a first direction D1, and the wordlines 22 are arranged in parallel along a third direction D3 that is perpendicular to the first direction D1. A plurality of third active areas 25 are arranged within the substrate 10 in an array, and each third active area 25 extends along a second direction D2. The second direction D2 is inclined relative to the first direction D1 for a predetermined angle. The specific numerical value of the predetermined angle can be set by persons skilled in the art according to actual requirement, for instance, the predetermined angle can be greater than or equal to 15° and less than 30°. Each third active area 25 has a first transistor T1 and a second transistor T2, and the first transistor T1 and the second transistor T2 are distributed at opposite sides of the third active area 25 along the second direction D2. Two wordlines 22 pass through one third active area 25 and respectively control the first transistor T1 and the second transistor T2 on the third active area 25. The depth of the first gate electrode 111 in the first transistor T1 extending into the substrate 10 is greater than the depth of the second gate electrode 121 in the second transistor T2 extending into the substrate 10, so that the area of the first channel region C1 of the first transistor T1 is greater than the area of the second channel region C2 of the second transistor T2. The first end 112 of the first transistor T1 and the second end 122 of the second transistor T2 are both located at opposite ends of the third active area 25, and the first transistor T1 and the second transistor T2 located in the same and single third active area 25 share a third common end. For instance, the first end 112 of the first transistor T1 is a drain end, the second end 122 of the second transistor T2 is a drain end, the third common end is a third common source end, and the first transistor T1 and the second transistor T2 in the same and single third active area 25 share the third common source end. The third common end can be disposed at the middle portion of the third active area 25, namely the part between two wordlines 22 on the third active area 25. In the same and single third active area 25, the first end 112 of the first transistor is for electrical connection with a first-type storage cell 15, and the second end 122 of the second transistor is for electrical connection with a second-type storage cell 17.

In some embodiments, the first transistor T1 in one of two adjacent third active areas 25 is oppositely arranged with respect to the second transistor T2 in another third active area 25 along the second direction.

In some embodiments, one third active area 25 is overlapped with two adjacent wordlines 22, and the first transistor T1 and the second transistor T2 disposed in the same and single third active area 25 respectively correspond to the two wordlines 22.

Specifically, as shown in FIG. 4, by configuring the types of transistors at close end portions in two adjacent third active areas 25 to be different on the second direction D2, and by enabling the first transistor T1 and the second transistor T2 in the same and single third active area 25 to correspond to two wordlines 22, it is made possible to simultaneously drive the first transistor T1 and the second transistor T2 in one third active area 25 respectively through two wordlines 22, thus helping simplify the drive method of the semiconductor structure, and it is also possible to base on actual requirement to choose whether to independently drive the first transistor T1, independently drive the second transistor T2, or simultaneously drive the first transistor T1 and the second transistor T2, thus enhancing use flexibility of the semiconductor structure.

In some embodiments, the first transistor T1 in one of two adjacent third active areas 25 and the second transistor T2 in another third active area 25 correspond to the same and single wordline 22 along the first direction.

Specifically speaking, by corresponding the first transistor T1 in one of two adjacent third active areas 25 and the second transistor T2 in another third active area 25 to the same and single wordline 22 on the extension direction of the wordline 22, it is made possible to drive the first transistor T1 and the second transistor T2 in the third active area arranged along the first direction D1 through one wordline, and on the basis that the density for arranging the third active areas 25 in the semiconductor structure can be enhanced, it is also made possible to improve storage performance of the semiconductor structure and enlarge the fields of application of the semiconductor structure through cooperation of the first transistor T1 and the second transistor T2.

In some embodiments, the depth of the first gate electrode 111 extending into the substrate 10 is in the range 0.6H-0.8H, and the depth of the second gate electrode 121 extending into the substrate 10 is in the range 0.3H-0.4H. Specifically, when the first end 112 of the first transistor T1 is electrically connected to a capacitance storage cell and the second end 122 of the second transistor is connected to a magnetic storage cell, and a single wordline 22 simultaneously controls the first transistor T1 and the second transistor T2, if the difference in depths of the first gate electrode 111 and the second gate electrode 121 extending into the substrate 10 is unduly large, it would be more difficult for the wordline 22 to control, and an unduly large range of the depth of the first gate electrode 111 extending into the substrate 10 would deteriorate the separation effect of the shallow groove separation structure 13. The aforementioned depth ranges of the first gate electrode 111 and the second gate electrode 121 makes it possible to best equalize the requirement for drive current and control difficulty, and also to achieve a better separation effect.

In some embodiments, mutually adjoining end portions of two adjacent third active areas 25 are all the first transistors T1 or the second transistors T2 along the first direction D1.

In some embodiments, the first transistors or the second transistors of the plurality of third active areas 25 are all connected to the same and single wordline 22 along the first direction D1.

FIG. 5 is a diagram schematically illustrating another mode of arranging a plurality of third active areas in the specific embodiments of the present application. Specifically, as shown in FIG. 5, by so adjusting the arranging mode of the third active areas 25 that mutually adjoining end portions of two adjacent third active areas 25 are all the first transistors T1 or the second transistors T2 along the first direction D1, it is made possible to enable one wordline 22 to simultaneously drive all first transistors T1 or second transistors T2 in a plurality of third active areas arranged along the first direction D1, thus simplifying the drive method of the semiconductor structure.

In some embodiments, the depth of the first gate electrode 111 extending into the substrate 10 is in the range 0.6H-0.8H, and the depth of the second gate electrode 121 extending into the substrate 10 is in the range 0.2H-0.3H. Specifically, when the first end 112 of the first transistor is electrically connected to a capacitance storage cell and the second end 122 of the second transistor is connected to a magnetic storage cell, and a single wordline 22 only controls the first transistor T1 or only controls the second transistor T2, the above depth ranges of the first gate electrode 111 and the second gate electrode 121 make it possible to obtain the optimal device performance Specifically, a larger depth of the first gate electrode 111 of the first transistor T1 extending into the substrate 10 can reduce leakage current as far as possible, while a lesser depth of the second gate electrode 121 of the second transistor T2 extending into the substrate 10 can decrease the short-channel effect at the same time of increasing drive current as far as possible.

In some embodiments, the first-type storage cell 15 includes anyone of a capacitance storage cell, a resistance storage cell, a magnetic storage cell, a phase-change storage cell and a ferroelectric storage cell; the second-type storage cell 17 includes anyone of a capacitance storage cell, a resistance storage cell, a magnetic storage cell, a phase-change storage cell and a ferroelectric storage cell; the first-type storage cell 15 and the second-type storage cell 17 are different in storage type.

In some embodiments, the first-type storage cell 15 is a capacitance storage cell, and the second-type storage cell 17 is a magnetic storage cell.

By way of example, as shown in FIG. 1, the first-type storage cell 15 is a capacitance storage cell, and the second-type storage cell 17 is a magnetic storage cell (such as a magnetic tuning junction). The capacitance storage cell is electrically connected to the first end 112 of the first transistor T1 via a first plug 14. The bottom end of the magnetic storage cell is connected to a bottom-contact electrode 181, the top end of the magnetic storage cell is connected to a top-contact electrode 182, the bottom-contact electrode 181 is electrically connected to the second end 122 of the second transistor T2 via a second plug 20, and the top-contact electrode 182 is electrically connected to a bitline 19 via a third plug 21.

Figure 6:
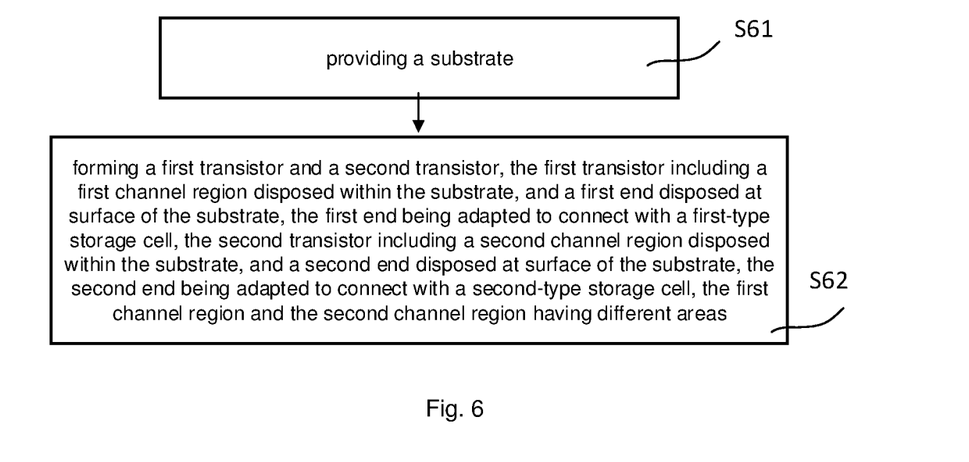
FIG. 6 is a flowchart illustrating the method of forming a semiconductor structure in the specific embodiments of the present application.

Furthermore, specific embodiments of the present application further propose a method of forming a semiconductor structure. FIG. 6 is a flowchart illustrating the method of forming a semiconductor structure in the specific embodiments of the present application. The semiconductor structure formed in the current specific embodiment is as schematically illustrated in FIGS. 1, 4 and 5. As shown in FIGS. 1 and 4-6, the method of forming a semiconductor structure proposed by the specific embodiments of the present application comprises the following steps:

Step S61—providing a substrate 10; and

Step S62—forming a first transistor T1 and a second transistor T2, the first transistor T1 including a first channel region C1 disposed within the substrate 10, and a first end 112 disposed at surface of the substrate 10, the first end 112 being adapted to connect with a first-type storage cell 15, the second transistor T2 including a second channel region C2 disposed within the substrate 10, and a second end 122 disposed at surface of the substrate 10, the second end 122 being adapted to connect with a second-type storage cell 17, the first channel region C1 and the second channel region C2 having different areas.

In some embodiments, the specific step of forming a first transistor T1 and a second transistor T2 includes the following:

forming an active area in the substrate 10;

forming in the active area respectively a first gate slot 114 enclosed by the first channel region C1 and a second gate slot 124 enclosed by the second channel region C2, the first gate slot 114 having a depth greater than depth of the second gate slot 124, the active area being cut by the first gate slot 114 and the second gate slot 124 into the first end 112, the second end 122, and a common end 16 between the first end 112 and the second end 122; and filling gate material into the first gate slot 114 and the second gate slot 124 to form a first gate electrode 111 and a second gate electrode 121.

In some embodiments, the substrate 10 has therein a plurality of active areas arranged in an array, and the adjacent active areas are separated from each other via a shallow groove separation structure 13; the shallow groove separation structure 13 has a height H, the depth of the first gate slot 114 is greater than or equal to 0.5H, and the depth of the second gate slot 124 is less than 0.5H.

In some embodiments, the method of forming a semiconductor structure further comprises the following steps:

etching the active area, to respectively form the first gate slot 114 and the second gate slot 124 at opposite sides of extension direction of the active area; and filling gate material in the first gate slot 114 and the second gate slot 124 in the active area, to form the first gate electrode 111 and the second gate electrode 121.

In some embodiments, the substrate 10 further includes therein a plurality of wordlines 22 extending along a first direction D1; a plurality of the active areas are arranged within the substrate 10 in an array, the active areas extend along a second direction D2, and the second direction D2 is inclined relative to the first direction D1 for a predetermined angle.

In some embodiments, the first transistor T1 in one of the adjacent two active areas is oppositely arranged with respect to the second transistor T2 in another active area along the second direction D2.

In some embodiments, the first transistors T1 or the second transistors T2 in the two adjacent active areas are respectively oppositely arranged with respect to each other along the second direction D2.

In some embodiments, the first transistors T1 or the second transistors T2 in the plurality of active areas all correspond to the same and single wordline 22 along the first direction D1.

In some embodiments, the first-type storage cell 15 includes anyone of a capacitance storage cell, a resistance storage cell, a magnetic storage cell, a phase-change storage cell and a ferroelectric storage cell; the second-type storage cell 17 includes anyone of a capacitance storage cell, a resistance storage cell, a magnetic storage cell, a phase-change storage cell and a ferroelectric storage cell; the first-type storage cell 15 and the second-type storage cell 17 are different in storage type.

In some embodiments, the first-type storage cell 15 is a capacitance storage cell, and the second-type storage cell 17 is a magnetic storage cell.

The semiconductor structure and its forming method proposed by the embodiments of the present application achieve the effect of making fabrication techniques of the first transistor and the second transistor compatible, and simplify the fabrication method of the semiconductor structure by simultaneously disposing in the semiconductor structure a first transistor for connection with a first-type storage cell and a second transistor for connection with a second-type storage cell, locating the first channel region of the first transistor and the second channel region of the second transistor both inside the substrate, and defining that the first channel region of the first transistor and the second channel region of the second transistor have different areas. Moreover, it is ensured that drive current of the first transistor is different from drive current of the second transistor, and this is conducive to enhancing integration density of the storage cells of the first transistor and/or the second transistor in the memory, reduces the size of the storage cells, improves the performance of the memory, and lays foundation for enlarging the fields of application of the memory.

The foregoing description is merely directed to embodiments preferred by the present application. As should be pointed out, persons ordinarily skilled in the art may further make various improvements and modifications without departing from the conception of the present application, and all such improvements and modifications shall also be regarded to fall within the protection scope of the present application.

What is claimed is:

1. A semiconductor structure, comprising:
    a substrate;
    a first transistor, including a first channel region disposed within the substrate, and a first end disposed at surface of the substrate, the first end being adapted to connect with a first-type storage cell; and
    a second transistor, including a second channel region disposed within the substrate, and a second end disposed at surface of the substrate, the second end being adapted to connect with a second-type storage cell, the first channel region and the second channel region having different areas.

2. The semiconductor structure according to claim 1, wherein
    a first gate electrode, disposed in a first gate slot enclosed by the first channel region; and
    a second gate electrode, disposed in a second gate slot enclosed by the second channel region.

3. The semiconductor structure according to claim 2, wherein the first gate electrode has a depth extending inside the substrate greater than a depth of the second gate electrode extending inside the substrate.

4. The semiconductor structure according to claim 3, wherein
    a plurality of active areas, arranged within the substrate in an array; and
    a shallow groove separation structure, disposed between adjacent active areas; wherein
    the shallow groove separation structure has a height H, the depth of the first gate electrode extending inside the substrate is greater than or equal to 0.5H, and the depth of the second gate electrode extending inside the substrate is less than 0.5H.

5. The semiconductor structure according to claim 4, wherein the depth of the second gate electrode extending inside the substrate is less than 0.5H and greater than or equal to 0.1H.

6. The semiconductor structure according to claim 4, wherein the plurality of active areas have therein at least one first active area, and the first active area has two of the first transistors; and
    the two first transistors are distributed at opposite sides of extension direction of the first active area, and the two first transistors in the first active area share a first common end.

7. The semiconductor structure according to claim 4, wherein the plurality of active areas have therein at least one second active area, and the second active area has two of the second transistors; and
    the two second transistors are distributed at opposite sides of extension direction of the second active area, and the two second transistors in the second active area share a second common end.

8. The semiconductor structure according to claim 4, wherein the plurality of active areas have therein at least one third active area, and the third active area has one first transistor and one second transistor; and
    the first transistor and the second transistor are distributed at opposite sides of extension direction of the third active area, and the first transistor and the second transistor in the third active area share a third common end.

9. The semiconductor structure according to claim 8, wherein a plurality of wordlines extending along a first direction; and
    a plurality of the third active areas are arranged within the substrate in an array, the third active areas extend along a second direction, and the second direction is inclined relative to the first direction for a predetermined angle; and
    the first transistor in one of the adjacent two third active areas is oppositely arranged with respect to the second transistor in another third active area along the second direction.

10. The semiconductor structure according to claim 9, wherein one third active area is overlapped with two adjacent wordlines; and
    the first transistor and the second transistor disposed in the same and single third active area respectively correspond to the two wordlines;

the first transistor in one of the adjacent two third active areas and the second transistor in another third active area correspond to the same and single wordline along the first direction.

11. The semiconductor structure according to claim 10, wherein the depth of the first gate electrode extending inside the substrate is in a range 0.6H-0.8H, and the depth of the second gate electrode extending inside the substrate is in a range 0.3H-0.4H.

12. The semiconductor structure according to claim 10, wherein mutually adjoining end portions of two adjacent third active areas are all the first transistors or the second transistors along the first direction;
the first transistors or the second transistors of the plurality of third active areas are all connected to the same and single wordline along the first direction;
the depth of the first gate electrode extending inside the substrate is in a range 0.6H-0.8H, and the depth of the second gate electrode extending inside the substrate is in a range 0.2H-0.3H.

13. The semiconductor structure according to claim 1, wherein
the first-type storage cell includes anyone of a capacitance storage cell, a resistance storage cell, a magnetic storage cell, a phase-change storage cell and a ferroelectric storage cell; and
the second-type storage cell includes anyone of a capacitance storage cell, a resistance storage cell, a magnetic storage cell, a phase-change storage cell and a ferroelectric storage cell; and
the first-type storage cell and the second-type storage cell are different in storage type.

14. A method of forming a semiconductor structure, comprising the following steps:
providing a substrate; and
forming a first transistor and a second transistor, the first transistor including a first channel region disposed within the substrate, and a first end disposed at surface of the substrate, the first end being adapted to connect with a first-type storage cell, the second transistor including a second channel region disposed within the substrate, and a second end disposed at surface of the substrate, the second end being adapted to connect with a second-type storage cell, the first channel region and the second channel region having different areas.

15. The method of forming a semiconductor structure according to claim 14, wherein the step of forming a first transistor and a second transistor includes the following:
forming an active area in the substrate;
forming in the active area respectively a first gate slot enclosed by the first channel region and a second gate slot enclosed by the second channel region, the first gate slot having a depth greater than depth of the second gate slot, the active area being cut by the first gate slot and the second gate slot into the first end, the second end, and a common end between the first end and the second end; and
filling gate material into the first gate slot and the second gate slot to form a first gate electrode and a second gate electrode.

16. The method of forming a semiconductor structure according to claim 15, wherein the substrate has therein a plurality of active areas arranged in an array, and the adjacent active areas are separated from each other via a shallow groove separation structure; and
the shallow groove separation structure has a height H, the depth of the first gate slot is greater than or equal to 0.5H, and the depth of the second gate slot is less than 0.5H.

17. The method of forming a semiconductor structure according to claim 15, wherein the following steps:
etching the active area, to respectively form the first gate slot and the second gate slot at opposite sides of extension direction of the active area; and
filling gate material in the first gate slot and the second gate slot in the active area, to form the first gate electrode and the second gate electrode.

18. The method of forming a semiconductor structure according to claim 14, wherein the substrate further includes therein a plurality of wordlines extending along a first direction; and
a plurality of the active areas are arranged within the substrate in an array, the active areas extend along a second direction, and the second direction is inclined relative to the first direction for a predetermined angle.

19. The method of forming a semiconductor structure according to claim 18, wherein the first transistor in one of the adjacent two active areas is oppositely arranged with respect to the second transistor in another active area along the second direction; and
the first transistors or the second transistors in the two adjacent active areas are respectively oppositely arranged with respect to each other along the second direction;
the first transistors or the second transistors in the plurality of active areas all correspond to the same and single wordline along the first direction.

20. The method of forming a semiconductor structure according to claim 19, wherein
the first-type storage cell includes anyone of a capacitance storage cell, a resistance storage cell, a magnetic storage cell, a phase-change storage cell and a ferroelectric storage cell; and
the second-type storage cell includes anyone of a capacitance storage cell, a resistance storage cell, a magnetic storage cell, a phase-change storage cell and a ferroelectric storage cell; and
the first-type storage cell and the second-type storage cell are different in storage type.

\* \* \* \* \*